United States Patent
Maeda et al.

(10) Patent No.: US 7,405,003 B2
(45) Date of Patent: Jul. 29, 2008

(54) ORGANIC SEMICONDUCTOR MATERIAL, ORGANIC SEMICONDUCTOR STRUCTURE, AND ORGANIC SEMICONDUCTOR DEVICE

(75) Inventors: Hiroki Maeda, Tokyo (JP); Ken Tomino, Tokyo (JP); Shigeru Sugawara, Tokyo (JP); Masahiro Funahashi, Sagamihara (JP); Junichi Hanna, Yokohama (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 323 days.

(21) Appl. No.: 11/092,238

(22) Filed: Mar. 29, 2005

(65) Prior Publication Data

US 2006/0076554 A1    Apr. 13, 2006

(30) Foreign Application Priority Data

Mar. 31, 2004    (JP) .............................. 2004-108528

(51) Int. Cl.
*B32B 9/00* (2006.01)
*C09K 19/34* (2006.01)
*H01L 51/54* (2006.01)

(52) U.S. Cl. .................. 428/411.1; 257/40; 525/299.61
(58) Field of Classification Search .............. 428/411.1; 257/40
See application file for complete search history.

(56) References Cited

U.S. PATENT DOCUMENTS 5,970,318 A  * 10/1999 Choi et al. ..................... 438/99

OTHER PUBLICATIONS

M. Funahashi and J. Hanna, "Photoconductive Behavior in Smectic A Phase of 2-(4'Heptyoxyphenyl)-6-Dodecylthiobenzothiazole", Jpn J. Appln. Phys., 35, L703-L705 (1996).

* cited by examiner

*Primary Examiner*—Ramsey Zacharia
(74) *Attorney, Agent, or Firm*—Ladas & Parry LLP

(57) ABSTRACT

An organic semiconductor material, enabling to exhibit liquid crystal phase at wide temperature range including at least ordinary temperature and to exhibit high charge carrier mobility, and an organic semiconductor structure and organic semiconductor device formed from the organic semiconductor material. The organic semiconductor material has a quaterthiophene skeleton as shown in a following chemical formula 1, wherein R1 in the chemical formula 1 is an alkyl group of C1 to C20 or a hydrogen, and R2 is an alkyl group of C1 to C20 or a hydrogen.

10 Claims, 1 Drawing Sheet

ORGANIC SEMICONDUCTOR MATERIAL, ORGANIC SEMICONDUCTOR STRUCTURE, AND ORGANIC SEMICONDUCTOR DEVICE

BACKGROUND OF THE INVENTION

1. Field of the Invention

The present invention relates to an organic semiconductor material, an organic semiconductor structure and an organic semiconductor device, wherein the organic semiconductor material exhibiting liquid crystal phase at wide temperature range, including at least ordinary temperature.

2. Description of the Related Art

In recent years, study about an organic semiconductor structure using an organic semiconductor material attracts attention, and its application to various devices is expected. As such application, a thin-film transistor (also called organic TFT) usable for a flexible display and the like, a light emitting element, solar battery and the like are being studied.

For the organic semiconductor structure, to be used at practical level, it is required to exhibit high charge carrier mobility at wide using temperature range. Also, preparation of a flexible molecular alignment film, which is uniform over a large area, is required. Therefore, it is desirable that the organic semiconductor structure exhibits liquid crystal phase at wide using temperature range (around −40 to +90° C.) including ordinary temperature, and that the liquid crystal phase has high charge carrier mobility.

Conventionally, for example, it has been reported that a rod-shaped liquid crystal material, such as a phenyl benzothiazole derivative, shows high charge carrier mobility in a liquid crystal state (for example, see M. Funahashi and J. Hanna, Jpn. J. Appl. Phys., 35, L703-L705 (1996)). Although this liquid crystal material shows liquid crystallinity at relatively high temperatures, this dose not show liquid crystallinity at wide using temperature range (around −40 to +90° C.) including ordinary temperature.

SUMMARY OF THE INVENTION

As described above, in conventional organic semiconductor material, there are few organic semiconductor materials exhibiting liquid crystal phase at wide temperature range including ordinary temperature. Therefore, such organic semiconductor material is desired. Also, development of the organic semiconductor material, enabling to exhibit high charge carrier mobility at wide temperature range including ordinary temperature, and organic semiconductor structure using this material is desired.

The present invention is accomplished in order to meat the above-described conventional demand. And the object is to provide an organic semiconductor material, enabling to exhibit liquid crystal phase at wide temperature range including at least ordinary temperature and to exhibit high charge carrier mobility, and an organic semiconductor structure and organic semiconductor device formed from the organic semiconductor material.

The organic semiconductor material of the present invention for achieving the object is an organic semiconductor material comprising a quaterthiophene skeleton shown in a following chemical formula 1, wherein R1 in the chemical formula 1 is an alkyl group of C1 to C20 or a hydrogen, and R2 is an alkyl group of C1 to C20 or a hydrogen.

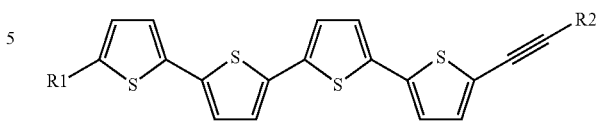

(1)

The organic semiconductor material of the present invention is able to exhibit liquid crystal phase at wide temperature range (around −40 to +90° C.) including at least ordinary temperature as well as high charge carrier mobility.

The organic semiconductor material of the present invention is, in the organic semiconductor material of the above-described invention, is characterized in that the organic semiconductor material comprising the quaterthiophene skeleton is shown by a following chemical formula 2.

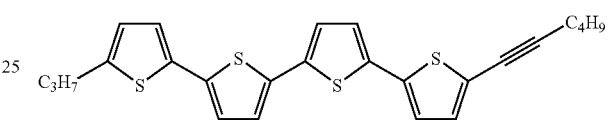

(2)

The organic semiconductor material of this invention is able to exhibit high-order smectic liquid crystal phase at least in a range of −40 to +90° C. Also, if an organic semiconductor layer is formed from this organic semiconductor material, it can exhibit charge carrier mobility of $10^{-1}$ $cm^2/V·s$ or higher.

The organic semiconductor structure of the present invention for achieving the object is an organic semiconductor structure comprising an organic semiconductor layer formed from the organic semiconductor material of the above-described invention, wherein the organic semiconductor layer has a high-order smectic liquid crystal phase at least at ordinary temperature range. In this invention, since the organic semiconductor layer has high-order smectic liquid crystal phase at least at ordinary temperature, the layer will be a flexible molecular alignment film, which is uniform over a large area, and this can be applied to a device such as thin-film transistor which is usable for a flexible display and the like.

The organic semiconductor device of the present invention for achieving the object is an organic semiconductor device comprising at least a substrate, a gate electrode, a gate-insulating layer, an organic semiconductor layer, a drain electrode, and a source electrode, wherein the organic semiconductor layer is formed from the organic semiconductor material of the above-described invention. Moreover, the organic semiconductor device is characterized in that the organic semiconductor layer has a charge carrier mobility of $10^{-1}$ $cm^2/V·s$ or higher at least at ordinary temperature range. In this invention, since the device exhibits high charge carrier mobility at wide using temperature range, this can be used at practical level.

In the present invention, above-described organic semiconductor structure of the present invention is used as an organic transistor, an organic EL element, an organic electronic device or an organic solar battery.

According to the organic semiconductor material of this invention, the material is able to exhibit high-order liquid crystal phase at least in a range of −40 to +90° C., and also, if an organic semiconductor layer is formed from this organic semiconductor material, it can exhibit charge carrier mobility of $10^{-1}$ cm$^2$/V·s or higher.

Further, according to the organic semiconductor structure of the present invention, since the constituting organic semiconductor layer has high-order smectic liquid crystal phase at wide using temperature range including at least ordinary temperature, the layer will be a flexible molecular alignment film, which is uniform over a large area, and this can be applied to a device such as thin-film transistor which is usable for a flexible display and the like.

Also, since the organic semiconductor device of the present invention exhibits high charge carrier mobility at wide using temperature range (around −40 to +90° C.), this can be used at practical level. As the result, this can be used for a thin-film transistor, which is usable for a flexible display and the like, a light emitting element, an organic solar battery and the like.

DESCRIPTION OF THE PREFERRED EMBODIMENT

Figure 1:
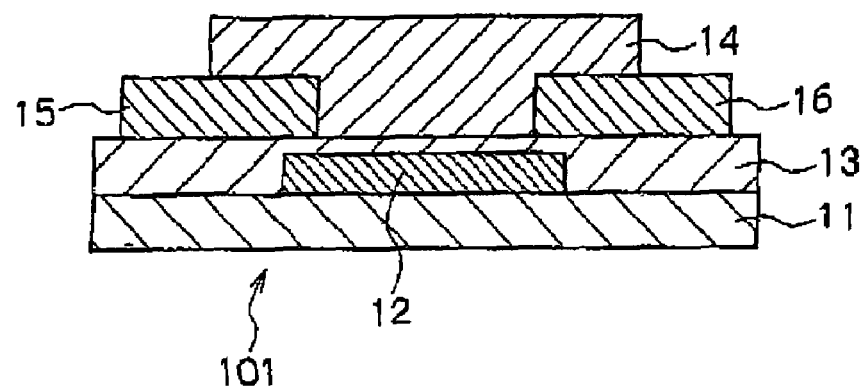
FIG. 1 is a sectional view showing one example of the organic semiconductor device of the present invention.

Hereinafter, the organic semiconductor material, the organic semiconductor structure and the organic semiconductor device of the present invention are described.

(Organic Semiconductor Material)

The organic semiconductor material of the present invention comprises a quaterthiophene skeleton shown in the above chemical formula 1, wherein R1 in the chemical formula 1 is an alkyl group of C1 to C20 or a hydrogen, and R2 is an alkyl group of C1 to C20 or a hydrogen. The alkyl group of R1 and R2 may be linear or branched chain.

The organic semiconductor material of the present invention can exhibit high-order liquid crystal phase at wide temperature range (−40 to +90° C.) including at least ordinary temperature. In the liquid crystal phase exhibiting an aggregated state of high order, crystal grain boundaries observed in a crystal phase, which is a barrier for charge carrier transfer, do not exist. Therefore, the organic semiconductor layer, which is able to realize high charge carrier mobility, can be formed.

In the present invention, specifically, the compound shown in the above chemical formula 2 can be listed. This organic semiconductor material can constitute the below-described organic semiconductor structure with high-order liquid crystal layer, and can exhibit high charge carrier transfer property of $10^{-1}$ cm$^2$/V·s or higher.

(Organic Semiconductor Structure)

The organic semiconductor structure of the present invention comprises an organic semiconductor layer formed from the above-described organic semiconductor material, wherein the organic semiconductor layer has a high-order smectic liquid crystal phase at least at ordinary temperature range.

In the organic semiconductor structure of the present invention, according to DSC measurement (differential scanning calorimeter), the phase of the organic semiconductor material, for example of the above chemical formula 2, forming the organic semiconductor layer is transferred from the liquid crystal phase to the isotropic phase at about 210° C. during a temperature raising process. And during a temperature lowering process, the phase is transferred from the isotropic phase to the liquid crystal phase at around 209° C. Further, the present inventors have confirmed that the phase transition from the liquid crystal phase to the crystal phase dose not occur until around −120° C.

The organic semiconductor layer is formed by aligning the organic semiconductor material of the present invention. As alignment means, the following means can be listed for example: the organic semiconductor material is laminated on a liquid crystal alignment layer formed from polyimide-based material; and the organic semiconductor material is laminated on a liquid crystal alignment layer formed from a curing resin having minute unevenness on the surface thereof.

Since the above-described organic semiconductor material has fluidity at temperature higher than the temperature at which it maintains the liquid crystal state, it can be coated in this state. By such method, the large area organic semiconductor layer having excellent charge carrier transfer property can be formed extremely easily. As coating methods at this time, various coating methods and printing methods can be used.

The organic semiconductor structure of the present invention includes the following embodiments: as the first embodiment, a substrate, a liquid crystal alignment layer, and an organic semiconductor layer are laminated sequentially; as the second embodiment, a substrate, an organic semiconductor layer, and a liquid crystal alignment layer are laminated sequentially; as the third embodiment, a substrate, a liquid crystal alignment layer, an organic semiconductor layer, and a liquid crystal alignment layer are laminated sequentially. In the present invention, by employing a configuration in which the organic semiconductor layer is contacted to a layer subjected to an alignment treatment, high alignment property can be imparted to the liquid crystal phase constituting the organic semiconductor material.

As described above, the organic semiconductor structure of the present invention comprises the organic semiconductor layer formed from the organic semiconductor material exhibiting high-order liquid crystal phase at wide temperature range including at least ordinary temperature. Therefore, the organic semiconductor layer can be used as a uniform molecular alignment film which maintains flexibility as liquid crystal. Moreover, since the organic semiconductor layer exhibits high-order liquid crystal phase at wide temperature range, it can realize a dense packing structure in configuration close to a molecular crystal phase, and can exhibit high charge carrier transfer property of $10^{-1}$ cm$^2$/V·s or higher. As the result, application to a semiconductor layer, such as a thin-film transistor and a field effect type transistor, can be expected.

(Organic Semiconductor Device)

As shown in FIG. 1, the organic semiconductor device 101 of the present invention is composed of at least substrate 11, gate electrode 12, gate-insulating layer 13, organic semiconductor layer 14, drain electrode 15 and source electrode 16. In the organic semiconductor device 101, the organic semiconductor layer 14 is formed from the organic semiconductor material constituting the organic semiconductor structure of the above-described present invention.

Examples of the constitution include: a reverse-staggered structure constituted of, on the substrate 11, the gate electrode 12, gate-insulating layer 13, aligned organic semiconductor layer 14, drain electrode 15 and source electrode 16 and protective layer 17 in this order; and a coplanar structure constituted of, on the substrate 11, the gate electrode 12, gate-insulating layer 13, drain electrode 15 and source electrode 16, organic semiconductor layer 14 and a protective layer (not shown in the figure) in this order. The organic semiconductor device 101 thus constituted is actuated in either one of an accumulated and empty state, depending on the polarity of voltage applied to the gate electrode 12. Hereinafter, components of the organic semiconductor device are described in detail.

(Substrate)

The substrate 11 can be selected from a wide variety of insulating materials. Examples of such materials include: inorganic materials such as glass and calcined alumina; and various kinds of insulating materials such as polyimide film, polyester film, polyethylene film, polyphenylene sulfide film and polyparaxylene film. Particularly, a film comprising a polymer compound is extremely useful because it can be used to produce a lightweight and flexible organic semiconductor device. The thickness of substrate 11 used in the present invention is about 25 μm to 1.5 mm.

(Gate Electrode)

The gate electrode 12 is preferably an electrode comprising an organic material such as polyaniline, polythiophene etc., or an electrode formed by coating conductive ink. Since these electrodes can be formed by coating the organic material or the conductive ink, there is an advantage that the electrode formation process is very easy. Specific means of coating includes spin coating method, casting method, pulling method, transferring method, ink jet method etc.

When forming a metal film as the electrode, conventional vacuum deposition methods can be used. Specifically, a mask film forming method or a photolithography method can be used. In this case, the following can be used as material for forming electrodes: metals such as gold, platinum, chromium, palladium, aluminum, indium, molybdenum, nickel and the like; alloys of these metal; and inorganic materials such as polysilicon, amorphous silicon, tin oxide, indium oxide, indium tin oxide (ITO) and the like. Two or more of these materials can be simultaneously used.

The thickness of the gate electrode is preferably about 50 to 1000 nm depending on the electric conductivity of its material. The lower limit of thickness of the gate electrode varies according to the electric conductivity of the electrode material and adhesion to a bedding substrate. The upper limit of thickness of the gate electrode should be in such a range that, upon providing the below-mentioned gate-insulating layer and a pair of source/drain electrodes, insulating coverage by the gate-insulating layer at a portion with a level difference, between the bedding substrate and the gate electrode, is sufficient. Also, it is necessary that an electrode pattern formed thereon should not be disconnected. Particularly, when a flexible substrate is used, stress balance should be taken into consideration.

(Gate-Insulating Layer)

The gate-insulating layer 13 is, similar to the gate electrode 12 described above, preferably formed by coating the organic material. As the organic material to be used, polychloropyrene, polyethylene terephthalate, polyoxymethylene, polyvinyl chloride, polyvinylidene fluoride, cyanoethyl pullulan, polymethyl methacrylate, polysulfone, polycarbonate, polyimide and the like can be listed. Specific means of coating includes spin coating method, casting method, pulling method, transferring method, ink jet method and the like. Further, conventional patterning process such as CVD method can be used. In this case, inorganic materials such as $SiO_2$, $SiN_x$ and $Al_2O_3$ are preferably used. Two or more of these materials can be simultaneously used.

Since the mobility in the organic semiconductor device depends on the strength of an electric field, the thickness of the gate-insulating layer is preferably about 50 to 300 nm. Withstand voltage at the time is desirably 2 MV/cm or higher.

(Drain Electrode and Source Electrode)

The drain electrode 15 and source electrode 16 are preferably formed from a metal of high work function. This is because the charge transporting carrier in the liquid crystalline organic semiconductor material described below is a hole, ohmic contact with the organic semiconductor layer 14 is necessary. The work function used herein is a potential difference necessary for taking an electron out of a solid, and is defined as a difference in energy between vacuum level and fermi level. The work function is preferably about 4.6 to 5.2 eV, and specific materials include gold, platinum, a transparent conductive film (indium tin oxide, indium zinc oxide, etc.). The transparent conductive film can be formed by sputtering method or electron beam (EB) deposition.

The thickness of the drain electrode 15 and source electrode 16 used in the present invention is about 50 to 00 nm.

(Organic Semiconductor Layer)

The organic semiconductor layer 14 is a layer formed from the organic semiconductor material of the above-described present invention. The organic semiconductor layer 14 to be formed has peculiar effects that it exhibits liquid crystal phase at wide temperature range including at least ordinary temperature, and large uniform organic semiconductor layer with few defects can be formed. Further, the charge transport speed which the organic semiconductor layer 14 succeeds is $10^{-1}$ cm$^2$/V·s or higher. Having such high charge transport speed, the organic semiconductor layer 14 has advantages that it can contribute to a reduction of operating voltage or improvement of corresponding speed of, for example, an organic thin-film transistor.

In a case that the surface on which the organic semiconductor material is formed is the gate-insulating layer or the substrate, the gate-insulating layer or the substrate can be integrated with the alignment treatment layer by carrying out the rubbing treatment to the gate-insulating layer or the substrate.

(Interlayer-Insulating Layer)

The organic semiconductor device 101 is desirably provided with an interlayer-insulating layer. When the drain electrode 15 and source electrode 16 are formed on the gate-insulating layer 13, the interlayer-insulating layer is formed for the purpose of preventing pollution of the surface of the gate electrode 12. Accordingly, the interlayer-insulating layer is formed on the gate-insulating layer 13 prior to the formation of the drain electrode 15 and source electrode 16. After the source electrode 15 and drain electrode 16 are formed, the interlayer-insulating layer is processed such that a part of the layer, disposed on the upper channel region, is completely or partially removed. The region of the interlayer-insulating layer to be removed is desirably similar to the size of the gate electrode 12.

The material constituting the interlayer-insulating layer includes inorganic materials such as $SiO_2$, $SiN_x$ and $Al_2O_3$, and organic materials such as polychloropyrene, polyethylene terephthalate, polyoxymethylene, polyvinyl chloride, polyvinylidene fluoride, cyanoethyl pullulan, polymethyl methacrylate, polysulfone, polycarbonate, and polyimide.

(Other Embodiments of Organic Semiconductor Device)

The organic semiconductor device of the present invention maybe constituted with any one of the following: (i) substrate/gate electrode/gate-insulating layer (also serving as an liquid crystal alignment layer)/source-drain electrodes/liquid crystal organicline semiconductor layer (/protective layer); (ii) substrate/gate electrode/gate-insulating layer/source-drain electrodes/liquid crystal alignment layer/liquid crystalline organic semiconductor layer (/protective layer); (iii) substrate/gate electrode/gate-insulating layer (also serving as a liquid crystal alignment layer)/liquid crystalline organic semiconductor layer/source-drain electrodes/(protective layer); (iv) substrate/gate electrode/gate-insulating layer (also serving as a liquid crystal alignment layer)/liquid crystalline organic semiconductor layer/substrate with source-drain electrodes patterned thereon (also serving as a protective layer); (v) substrate/source-drain electrodes/liquid crystalline organic semiconductor layer/gate-insulating layer (also serving as a liquid crystal alignment layer)/gate electrode/substrate (also serving as a protective layer); (vi) substrate (also serving as an alignment layer)/source-drain electrodes/liquid crystalline organic semiconductor layer/gate-insulating layer/gate electrode/substrate (also serving as a protective layer); and (vii) substrate/gate electrode/gate-insulating layer/source-drain electrodes/liquid crystalline organic semiconductor layer/substrate (also serving as an alignment layer).

In these organic semiconductor device, by using the organic semiconductor material of the present invention, the organic semiconductor layer can be formed easily by a coating system.

EXAMPLES

Hereinafter, the present invention is described in more detail.

<Synthesis of Quaterthiophene Derivative>

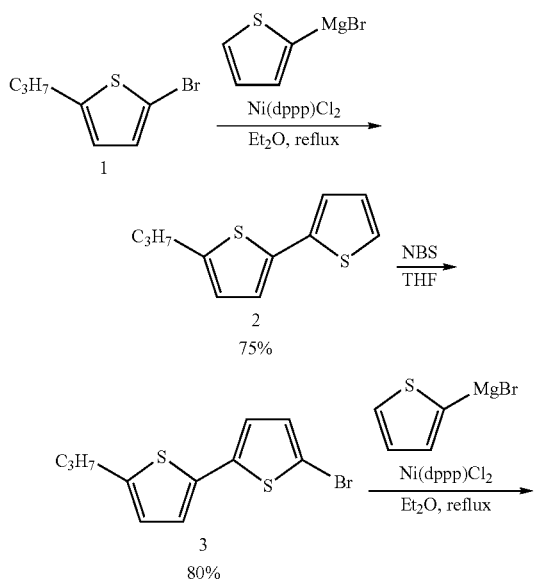

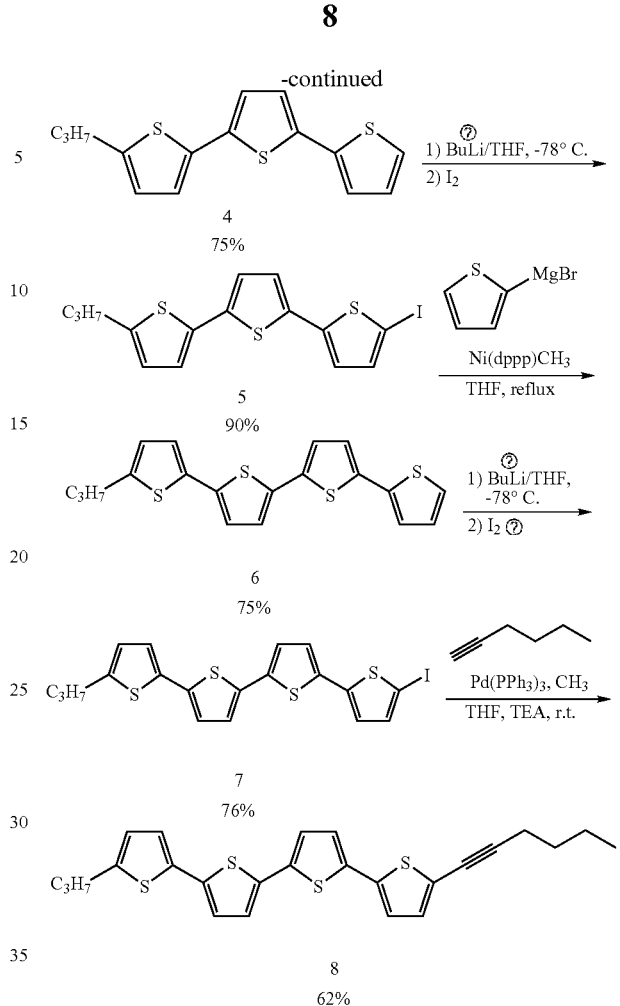

Synthesis of 2-propylthiophene

First, 10 ml (0.125 mol, 1.2 eq) of thiophene was introduced into a three-necked flask, and this was flushed with Ar. To this, 30 ml of THF was added, stirred, and cooled to −78° C. To this, 40 ml (0.104 mol, 1 eq) of 2.6 mol n3 uLi was dropped. After dropping, after stirring for 1 hours, the temperature was returned to 0° C. To this, 10.4 ml (0.104 mol, 1 eq) of 3-bromopropane was dropped. After dropping, after stirring for 1 hour, the temperature was returned to the room temperature, and stirred for further 12 hours. This was extracted with diethyl ether, water washed until pH is 7, and dehydrated with $Na_2SO_4$. After removing $Na_2SO_4$ by filtration, the solvent was removed. This was purified by silica gel chromatography, and specified substance of 2-propylthiophene was obtained (actually, distillation. Boiling point 75° C., 15 mmHg). Yielding quantity was around 12 g, and yielding percentage was around 90%.

(1: Synthesis of 2-bromo-5-propylthiophene)

Next, 10 g (0.079 mol, 1 eq) of the obtained 2-propylthiophene was introduced into a three-necked flask, and this was flushed with Ar. To this, 100 ml of THF was added, stirred, and cooled to 0° C. To this, 15.5 g (0.087 mol. 1 eq) of NBS was added directly. After that, the temperature was returned to the room temperature, and stirred for 12 hours. To this, 20 ml of 10% sodium carbonate aqueous solution was added, extracted with diethyl ether, water washed until pH is 7, and dehydrated with $Na_2SO_4$. After removing $Na_2SO_4$ by filtration, the solvent was removed. This was purified by silica gel chromatography, and specified substance of 2-bromo-5-propylthiophene (1 in the chemical reaction formula) was obtained. Yielding quantity was around 14 g, and yielding percentage was around 85%.

(2: Synthesis of 5-propyl-2,5'-bithiophene)

Next, 12 g (0.056 mol, 1 eq) of she obtained 2-bromo-5-propylthiophene and 20.08 g (0.148 mmol, 0.0025 eq) Ni (dppp) $Cl_2$ were introduced into a three-necked flask, and this was flushed with Ar. To this, 100 ml of diethyl ether was added and stirred (reaction fluid α). 1.87 g (0.077 mol, 1.38 eq) of Mg was introduced to another three-necked flask, and flushed with Ar. To this, 50 ml of diethyl ether was added and stirred. To this, a solution, of which 11.4 g (0.07 mol, 1.25 eq) of 2-bromothiophene was diluted with 50 ml of diethyl ether, was dropped. After dropping, this was refluxed for 2 hours, and was laid for cooling (reaction fluid β). The reaction fluid β was dropped to the reaction fluid α, which was cooled to 0° C. After dropping, this was stirred for 2 hours and was refluxed for 12 hours. This was cooled to 0° C., 70 ml of 2N—HCl was dropped. After dropping, the temperature was returned to the room temperature, and stirred for 2 hours. This was extracted with diethyl ether, water washed with $Na_2CO_3$ aqueous solution until pH is 7, and dehydrated with $Na_2SO_4$. After removing $Na_2SO_4$ by filtration, the solvent was removed. This was purified by silica gel chromatography, and specified substance of 5-propyl-2,2'-bithiophene (2 in the chemical reaction formula) was obtained. Yielding quantity was around 9 g, and yielding percentage was 75%.

(3: Synthesis of 5-bromo-5'-propyl-2,2'-bithiophene)

Next, 8 g (0.038 mol, 1 eq) of the obtained 5-propyl-2,2'-bithiophene was introduced into a three-necked flask, and this was flushed with Ar. To this, 100 ml of THF was added, stirred and cooled to 0° C. To this, 7.4 g (0.042 mol, 1.1 eq) of NBS was added directly. Then, the temperature was returned to the room temperature, and stirred for 12 hours. To this, 10% sodium carbonate aqueous solution was added, this was extracted with diethyl ether, water washed until pH is 7, and dehydrated with $Na_2SO_4$. After removing $Na_2SO_4$ by filtration, the solvent was removed. This was purified by silica gel chromatography, and specified substance of 5-bromo-5'-propyl-2,2'-bithiophene (3 in the chemical reaction formula) was obtained. Yielding quantity was around 8.8 g, and yielding percentage was around 80%.

(4: Synthesis of 5-propyl-2,2':5',2''-terthiophene)

Next, 8 g (0.028 mol, 1 eq) of the obtained 5-bromo-5'-propyl-2,2'-bithiophene and 0.04 g (0.07 mmol, 0.0025 eq) of Ni (dppp) $Cl_2$ were introduced into a three-necked flask, and this was flushed with Ar. To this, 100 ml of diethyl ether was added and stirred (reaction fluid α). 0.94 g (0.0385 mol, 1.38 eq) of Mg was introduced to another three-necked flask, and flushed with Ar. To this, 50 ml of diethyl ether was added and stirred. To this, a solution, of which 5.7 g (0.035 mol, 1.25 eq) of 2-bromothiophene was diluted with 50 ml of diethyl ether, was dropped. After dropping, this was refluxed for 2 hours, and was laid for cooling (reaction fluid β). The reaction fluid β was dropped to the reaction fluid α, which was cooled to 0° C. After dropping, this was stirred for 2 hours and was refluxed for 12 hours. This was cooled to 0° C., 30 ml of 2N—HCl was dropped. After dropping, the temperature was returned to the room temperature, and stirred for 2 hours. This was extracted with chloroform, water washed with $Na_2CO_3$ aqueous solution until pH is 7, and dehydrated with $Na_2SO_4$. After removing $Na_2SO_4$ by filtration, the solvent was removed. This was purified by silica gel chromatography, and specified substance of 5-propyl-2,2':5',2''-terthiophene (4 in the chemical reaction formula) was obtained. Yielding quantity was around 6 g, and yielding percentage was 75%.

(5: Synthesis of 5-propyl-5''-iode-2,2':5'''-terthiophene)

Next, 5 g (17 mmol, 1 eq) of the obtained 5-propyl-2,2':5',2''-terthiophene was introduced into a three-necked flask, and this was flushed with Ar. To this, 100 ml of THF was added, stirred and cooled to −78° C. To this, 7.8 ml (20.4 mmol, 1.2 eq) of 2.6 M nBuLi was dropped. After dropping, after stirring for 1 hour, the temperature was returned to 0° C. To this, 6.47 g (25.5 mmol, 1.5 eq) of 12 was added directly. After dropping, after stirring for 1 hour, the temperature was returned to the room temperature, and stirred for further 12 hours. This was extracted with chloroform, water washed until pH is 7, and dehydrated with $Na_2SO_4$. After removing $Na_2SO_4$ by filtration, the solvent was removed. This was purified by silica gel chromatography, and specified substance of 5-propyl-5'-iode-2,2':5',2''-terthiophene (5 in the chemical reaction formula) was obtained. Yielding quantity was around 6.4 g, and yielding percentage was around 90%.

(6: Synthesis of 5-propyl-2,2':5',2'':5'',2'''-quaterthiophene)

First, 200 ml of THF was added to 0.94 g (0.0385 mol, 1.9 eq) of Mg and this was stirred. To this, 5.7 g (0.035 mol, 1.75 eq) of 2-bromothiophene was dropped and this was refluxed for 2 hours. Then, the reaction solution was cooled to 0° C., 0.04 g (0.07 mmol, 0.0035 eq) of Ni (dppp) $Cl_2$ and 8.2 g (20.0 mmol, 1 eq) of 5-propyl-5''-iode-2,2':5',2''-terthiophene were added, and refluxed for 10 hours. Then, this was cooled to 0° C., and 30 ml of 2N—HCl was dropped. After dropping, the temperature was returned to the room temperature, and stirred for 2 hours. This was extracted with chloroform, water washed with $Na_2CO_3$ aqueous solution until pH is 7, and dehydrated with $Na_2SO_4$. After removing $Na_2SO_4$ by filtration, the solvent was removed. This was purified by silica gel chromatography, and specified substance of 5-propyl-2,2':5',2'':5'',2'''-quaterthiophene (6 in the chemical reaction formula) was obtained. Yielding quantity was around 6 g, and yielding percentage was around 75%.

(7: Synthesis of 5-propyl-5'''-iode-2,2':5',2'':5'',2'''-quaterthiophene)

Next, 5 g (13.4 mmol, 1 eq) of the obtained 5-propyl-2,2':5',2'':5'',2'''-quaterthiophene was introduced into a three-necked flask, and this was flushed with Ar. To this, 200 ml of THF was added, stirred and cooled to −78° C. To this, 6.2 ml (16.1 mmol, 1.2 eq) of 2.6 mol nBuLi was dropped. After dropping, after stirring for 1 hour, the temperature was returned to 0° C. To this, 5.1 g (20.1 mmol, 1.5 eq) of $I_2$ was added directly. After dropping, after stirring for 1 hour, the temperature was returned to the room temperature, and stirred for further 12 hours. This was extracted with chloroform, water washed until pH is 7, and dehydrated with $Na_2SO_4$. After removing $Na_2SO_4$ by filtration, the solvent was removed. This was purified by silica gel chromatography, and specified substance of 5-propyl-5'''-iode-2,2':5',2'':5'',2'''-quaterthiophene (7 in the chemical reaction formula) was obtained. Yielding quantity was around 5 g, and yielding percentage was around 76%.

(8: Synthesis of 5-propyl-(5'''-hexyl-1-yne)-2,2':5',2'';5'',2'''-quaterthiophene)

Next, 4.5 g (9.0 mmol, 1 eq) of the obtained 5-propyl-5'''-iode-2,2':5',2'':5'',2'''-quaterthiophene, 0.032 g (0.045 mmol, 0.005 eq) of Pd(PPh_3)Cl_2, and 0.0085 g (0.045 mmol, 0.005 eq) of CuI were introduced into a three-necked flask, and this was flushed with Ar. To this, 200 ml of THF, 5 ml of TEA and 1.48 g (18 mmol, 2 eq) of 1-hexyne were added, and this was stirred for 5 hours. This was extracted with diethyl ether, water washed, and dehydrated with $Na_2SO_4$. After removing $Na_2SO_4$ by filtration, the solvent was removed. This was purified by silica gel chromatography, and specified substance of 5-propyl-(5'''-hexyl-1-yne)-2,2':5',2'':5'',2'''-quaterthiophene (8 in the chemical reaction formula) according to the present invention was obtained. Yielding quantity was around 2.5 g, and yielding percentage was around 62%.

(NMR Data)

NMR data for the quaterthiophene derivative 5-propyl-(5'''-hexyl-1-yne)-2,2':5',2'':5'',2'''-quaterthiophene obtained as described above is as follow.

δ=0.95 (3H, t, J=8.0 Hz), 1.02 (3H, t, J=8.0 Hz), 1.50 (2H, m), 1.61 (2H, m), 1.69 (2H, m), 2.48 (2H, t, J=6.7 Hz), 2.82 (2H, t, 9.3 Hz), 6.83 (1H, d, J=3.7 Hz), 6.99 (4H, m), 7.0 (2H, s), 7.1 (1H, d, J=3.2) in $CDCl_3$.

<Phase Series>

According to DSC measurement for the obtained quaterthiophene derivative 5-propyl-(5'''-hexyl-1-yne)-2,2':5',2'':5'',2'''-quaterthiophene (8 in the chemical reaction formula), an endothermic peak was observed at around 210.2° C. during the temperature raising process. And during the temperature lowering process, an exothermic peak was observed at around 208.7° C. A texture observation by a polarizing microscope was carried out for a glass cell having the obtained quaterthiophene derivative injected into thereof. A phase transition from the liquid crystal phase to the isotropic phase was confirmed at around 210° C., at which the endothermic peak was observed during the temperature raising process, and the phase was transferred from the isotropic phase to the liquid crystal phase at around 209° C., at which the exothermic peak was observed during the temperature lowering process. Moreover, phase transition from the liquid crystal phase to the crystal phase did not occur until −120° C. By X-ray diffraction measurement, it was confirmed that this quaterthiophene derivative exhibits long-distance order, which is peculiar to the smectic phase, at least at ordinary temperature.

<Charge Carrier Mobility Measurement>

Figure 2:
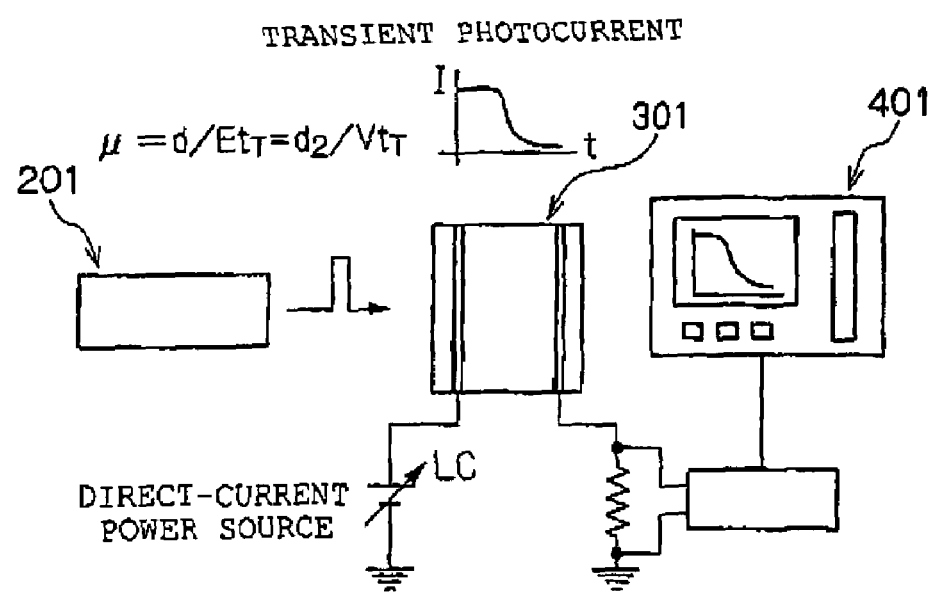
FIG. 2 is a schematic diagram showing time of flight measurement (TOF method).

The obtained quaterthiophene derivative, 5-propyl-(5'''-hexyl-1-yne)-2,2':5',2'':5'',2'''-quaterthiophene (8 in the chemical reaction formula), was injected into a glass cell equipped with an ITO (indium tin oxide) electrode, and charge carrier mobility was measured by time of flight measurement (TOF method), on a hot plate, with the device shown in FIG. 2. The quaterthiophene derivative exhibited the smectic phase at ordinary temperature, and the hole charge carrier mobility at ordinary temperature was $1 \times 10^{-1}$ cm$^2$/V·s. In the time of flight measurement, a procedure in which a sample was excited by an N2 pulse laser of a wavelength of 337 nm, was used in this example. In FIG. 2, the reference numeral 201 is the N2 pulse laser, the reference numeral 301 is the sample, and the reference numeral 401 is a digital oscilloscope.

Few conventional liquid crystalline organic semiconductor materials exhibit high charge carrier mobility at temperature range including the ordinary temperature. However, the quaterthiophene derivative of the present invention is confirmed that it exhibits high charge carrier mobility of around $1 \times 10^{-1}$ cm$^2$/V·s or higher at temperature range including the ordinary temperature.

As described above, the quaterthiophene derivative of the present invention is confirmed that it exhibits the liquid crystal phase of high-order aggregated state at using temperature range of at least −40 to +90° C., and further, the high charge transport was confirmed. When the quaterthiophene derivative of the present invention is applied to an organic transistor, not only exhibiting similar or better properties as the conventional thiophene skeleton material, but also it is excellent in that deterioration of the charge transport ability, due to crystal grain boundaries deriving from the liquid crystallinity, hardly occurs at wide temperature range including the ordinary temperature.

What is claimed is:

1. An organic semiconductor material comprising a quaterthiophene skeleton shown in a following chemical formula 1, wherein R1 in the chemical formula 1 is an alkyl group of C1 to C20 or a hydrogen, and R2 is an alkyl group of C1 to C20 or a hydrogen (1)

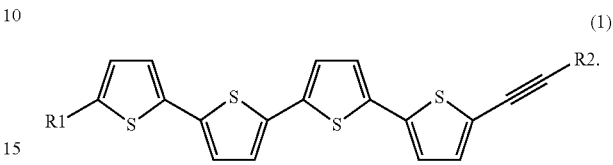

2. The organic semiconductor material according to claim 1, wherein the organic semiconductor material comprising the quaterthiophene skeleton is shown by a following chemical formula 2

(2)

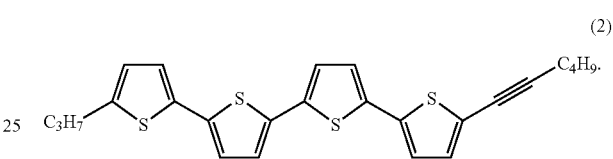

3. An organic semiconductor structure comprising an organic semiconductor layer formed from the organic semiconductor material according to claim 1, wherein the organic semiconductor layer has a high-order smectic liquid crystal phase at least in a temperature range of −40° C to 90° C.

4. An organic semiconductor structure comprising an organic semiconductor layer formed from the organic semiconductor material according to claim 2, wherein the organic semiconductor layer has a high-order smectic liquid crystal phase at least in a temperature range of −40° C to 90° C.

5. An organic semiconductor device comprising at least a substrate, a gate electrode, a gate-insulating layer, an organic semiconductor layer, a drain electrode, and a source electrode, wherein the organic semiconductor layer is formed from the organic semiconductor material according to claim 1.

6. The organic semiconductor device according to claim 5, wherein the organic semiconductor layer has an charge carrier mobility of $10^{-1}$ cm$^2$/V·s or higher at least in a temperature range of −40° C. to 90° C.

7. An organic semiconductor structure according to claim 3, wherein the organic semiconductor structure is utilized in the manufacture of at least one of the group consisting of an organic transistor, an organic EL element, an organic electronic device or an organic solar battery.

8. An organic semiconductor structure according to claim 4, wherein the organic semiconductor structure is utilized in the manufacture of at least one of the group consisting of an organic transistor, an organic EL element, an organic electronic device or an organic solar battery.

9. An organic semiconductor device according to claim 5, wherein the organic semiconductor device is utilized in the manufacture of at least one of the group consisting of an organic transistor, an organic EL element, an organic electronic device or an organic solar battery.

10. An organic semiconductor device according to claim 6, wherein the organic semiconductor device is utilized in the manufacture of at least one of the group consisting of an organic transistor, an organic EL element, an organic electronic device or an organic solar battery.

* * * * *